(12) United States Patent
Tsubouchi et al.

(10) Patent No.: US 11,496,084 B2
(45) Date of Patent: Nov. 8, 2022

(54) SEMICONDUCTOR DEVICE

(71) Applicant: DAIKIN INDUSTRIES, LTD., Osaka (JP)

(72) Inventors: Kazuya Tsubouchi, Osaka (JP); Masaki Kono, Saka (JP)

(73) Assignee: DAIKIN INDUSTRIES, LTD., Osaka (JP)

(*) Notice: Subject to any disclaimer, the term of this patent is extended or adjusted under 35 U.S.C. 154(b) by 0 days.

(21) Appl. No.: 17/012,937

(22) Filed: Sep. 4, 2020

(65) Prior Publication Data
US 2020/0403551 A1 Dec. 24, 2020

Related U.S. Application Data

(63) Continuation of application No. PCT/JP2019/005071, filed on Feb. 13, 2019.

(30) Foreign Application Priority Data

Mar. 29, 2018 (JP) .............................. JP2018-064378

(51) Int. Cl.
*H02P 27/08* (2006.01)
*H02P 29/50* (2016.01)

(52) U.S. Cl.
CPC ............ *H02P 27/085* (2013.01); *H02P 29/50* (2016.02)

(58) Field of Classification Search
CPC .... H02P 27/085; H02P 29/50; H02M 1/0029; H02M 1/084
See application file for complete search history.

(56) References Cited

U.S. PATENT DOCUMENTS

| | | | |
|---|---|---|---|
| 2001/0002782 A1 | 6/2001 | Shimane et al. | |
| 2007/0200613 A1 | 8/2007 | Ishikawa et al. | |
| 2012/0062167 A1 | 3/2012 | Hachiya et al. | |
| 2014/0042948 A1* | 2/2014 | Green | H02P 23/30 318/503 |
| 2014/0306628 A1* | 10/2014 | Benson | H02P 6/04 318/400.17 |

(Continued)

FOREIGN PATENT DOCUMENTS

| | | |
|---|---|---|
| JP | 2007-228447 A | 9/2007 |
| JP | 2012-60820 A | 3/2012 |

(Continued)

OTHER PUBLICATIONS

International Search Report, issued in PCT/JP2019/005071, PCT/ISA/210, dated Apr. 9, 2019.

(Continued)

*Primary Examiner* — Rina I Duda
(74) *Attorney, Agent, or Firm* — Birch, Stewart, Kolasch & Birch, LLP

(57) ABSTRACT

A gate voltage control/gate resistance changing circuit (21) is accommodated in the same package (P1) as a switching element (11), and outputs a driving signal to the switching element (11) to control turning on and off of the switching element (11). When an external signal is input from outside of the package (P1) to a terminal (3c) of the package (P1), a changing unit (221) accommodated in the package (P1) changes the switching speed of the switching element (11) based on the signal.

4 Claims, 7 Drawing Sheets

(56) References Cited

U.S. PATENT DOCUMENTS

| | | | |
|---|---|---|---|
| 2015/0169025 A1* | 6/2015 | Sizikov | G06F 1/32 |
| | | | 713/322 |
| 2016/0043670 A1* | 2/2016 | Nakamura | H02P 29/032 |
| | | | 318/400.17 |
| 2016/0211767 A1 | 7/2016 | Hotta | |
| 2016/0219689 A1* | 7/2016 | Nakamura | H01L 25/072 |
| 2019/0097563 A1 | 3/2019 | Shimomugi et al. | |

FOREIGN PATENT DOCUMENTS

| | | |
|---|---|---|
| JP | 2014-14233 A | 1/2014 |
| JP | 2015-65742 A | 4/2015 |
| WO | WO 2017/037942 A1 | 3/2017 |
| WO | WO 2017/159057 A1 | 9/2017 |

OTHER PUBLICATIONS

Extended European Search Report for European Application No. 19778248.5, dated Sep. 23, 2021.

* cited by examiner

SEMICONDUCTOR DEVICE

CROSS REFERENCE TO RELATED APPLICATIONS

This application is a Continuation of PCT International Application No. PCT/JP2019/005071 filed on Feb. 13, 2019, which claims priority under 35 U.S.C. § 119(a) to Patent Application No. 2018-064378 filed in Japan on Mar. 29, 2018, all of which are hereby expressly incorporated by reference into the present application.

TECHNICAL FIELD

The present disclosure relates to a semiconductor device.

BACKGROUND ART

Some semiconductor devices include a switching element and a switching control circuit that controls an ON/OFF operation of the switching element.

In the control of the switching control circuit, an EMI (Electromagnetic Interference) noise and a switching loss are desirably reduced. The EMI noise tends to intensify with an increase in a change amount dv/dt of gate voltage of the switching element per unit time (switching speed acceleration). The EMI noise interrupts the control of the electronic device. Thus, the EMI noise is desirably reduced. Further, the switching loss is synonymous to a power loss which is caused when the switching element is switched on or off, and is desirably reduced in view of reducing of power consumption.

As a related technique, Patent Document 1 discloses a switching element control circuit that increases the switching speed and reduces the switching loss.

CITATION LIST

Patent Document

Patent Document 1: Japanese Patent No. 2007-228447

SUMMARY

A first aspect of the present disclosure is directed to a semiconductor device including: a switching element (11, 11a to 11f); a switching control unit (21, 21a to 21f) accommodated in a same package (P1) as the switching element (11, 11a to 11f) and outputs a driving signal to the switching element (11, 11a to 11f) to control turning on and off of the switching element (11, 11a to 11f); an input section (3d, 3e) that receives an external signal relating to a switching speed at which the switching element (11, 11a to 11f) is turned on and off, input from the outside of the package (P1); and a changing section (221, 229, 23) accommodated in the package (P1), and changes the switching speed of the switching element (11, 11a to 11f) based on the external signal.

DESCRIPTION OF EMBODIMENTS

First Embodiment

<Configuration>

Figure 1:
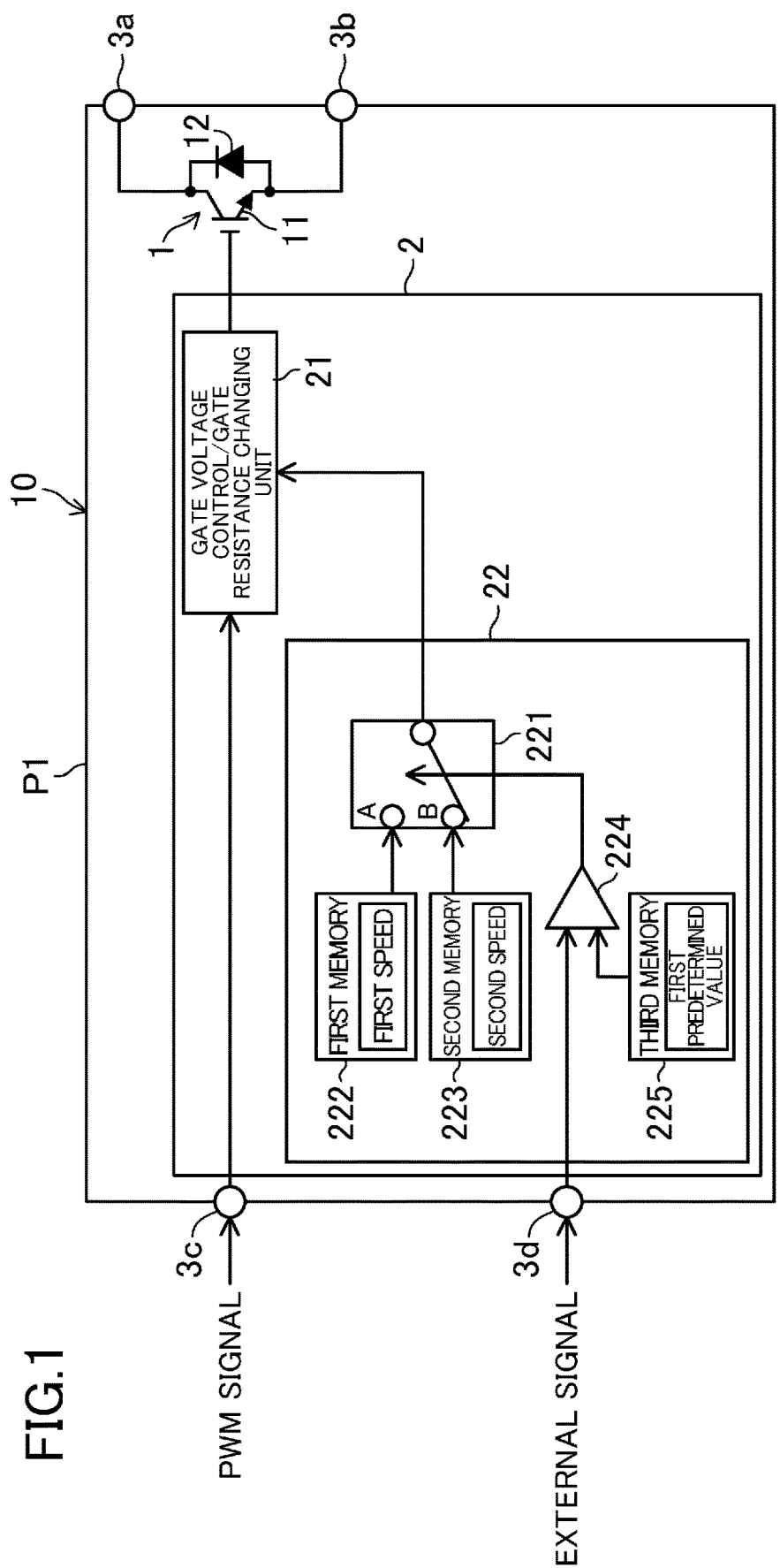
FIG. 1 is a circuit diagram illustrating a configuration of a semiconductor device of a first embodiment.

FIG. 1 is a circuit diagram illustrating a configuration of a semiconductor device (10) of a first embodiment. As shown in FIG. 1, the semiconductor device (10) has a power module (1) and a gate control circuit (2) connected to an input of the power module (1). The power module (1) and the gate control circuit (2) are accommodated in one chip, that is, in one package (P1).

An outer periphery of the package (P1) is provided with a plurality of terminals (3a, 3b, 3c, 3d).

—Terminals—

The terminals (3a, 3b) are connected to the power module (1) inside the package (P1). Specifically, the terminals (3a, 3b) are connected to a drain terminal and a source terminal of a switching element (11) in the power module (1), respectively. Although not shown, the terminals (3a, 3b) are connectable, outside the package (P1), to a target to which the power module supplies electric power (e.g., an electric motor for a compressor of an air conditioner). That is, the terminals (3a, 3b) may be output terminals such as inverter circuits including a power module (1) as a component.

The terminals (3c, 3d) are connected to the gate control circuit (2) inside the package (P1). The terminals (3c, 3d) receive a signal from the outside of the semiconductor device (10) (i.e., the outside of the package (P1)). Specifically, the terminal (3c) receives a PWM signal from the outside of the package (P1) (semiconductor device (10)). The PWM signal is input to a gate voltage control/gate resistance changing circuit (21) in the gate control circuit (2). The terminal (3d) corresponds to an input section, and receives a signal relating to a switching speed of the switching element (11) as an external signal from the outside of the package (P1) (semiconductor device (10)). The external signal is, for example, a signal expressed in a voltage range from 0 V to 20 V which is a power source of the power module (1), and is input to a switching speed selection circuit (22) in the gate control circuit (2).

—Power Module—

The power module (1) includes a switching element (11) and a freewheeling diode (12). The switching element (11) is constituted by a semiconductor element made of a wide-bandgap semiconductor as a main material. The freewheeling diode (12) is connected in antiparallel to the switching element (11).

Here, the wide-bandgap semiconductor may be silicon carbide (SiC), a gallium nitride (GaN)-based material, or diamond. Alternatively, the wide-bandgap semiconductor can be a semiconductor containing silicon nitride, gallium nitride-based material, or diamond as a main material.

—Gate Control Circuit—The gate control circuit (2) includes the gate voltage control/gate resistance changing circuit (21) which is a switching control unit, and the switching speed selection circuit (22).

—Gate Voltage Control/Gate Resistance Changing Circuit—

The gate voltage control/gate resistance changing circuit (21) has its output connected to a gate terminal of the switching element (11), and outputs a driving signal to the switching element (11) to control turning on and off of the switching element (11). Specifically, the gate voltage control/gate resistance changing circuit (21) outputs the driving signal for increasing a gate driving voltage or reducing a gate driving resistance in order to achieve the switching speed set in the switching speed selection circuit (22).

—Switching Speed Selection Circuit—

When the external signal is input from the outside of the package (P1) (semiconductor device (10)) to the terminal (3d), the switching speed selection circuit (22) selects, based on the external signal, a first speed or a second speed as the switching speed of the switching element (11). The switching speed selection circuit (22) includes a changing unit (221) which is a changing section, a first memory (222), a second memory (223), a third memory (225), and a comparator (224).

—Memory—Each memory (222, 223, and 225) is constituted by, for example, a semiconductor memory. The first memory (222) stores a first speed, and the second memory (223) stores a second speed. Each of the first memory (222) and the second memory (223) corresponds to a storage unit. The third memory (225) stores a first predetermined value. The first speed, the second speed, and the first predetermined value are set in advance, as appropriate.

Note that the first speed and the second speed differ from each other.

—Comparator—

The comparator (224) is constituted by, for example, a comparator circuit. The comparator (224) has two input terminals. One of the terminals is connected to the third memory (225) and inputs the first predetermined value to the comparator (224). The other terminal is connected to the terminal (3d) and inputs the external signal to the comparator (224). The comparator (224) has an output terminal which is connected to the changing unit (221). When the external signal is input from the outside of the package (P1) (semiconductor device (10)) via the terminal (3d), the comparator (224) compares the external signal with the first predetermined value. The comparator (224) outputs a result of the comparison from the output terminal to the changing unit (221).

—Changing Unit—The changing unit (221) is constituted by, for example, a switch. The changing unit (221) has two contact points A and B to which the first memory (222) and the second memory (223) are connected, respectively. Further, the changing unit (221) is connected to the output of the comparator (224), and is an input destination of the comparison result of the comparator (224). The changing unit (221) has an output terminal which is connected to the gate voltage control/gate resistance changing circuit (21). The changing unit (221) changes the switching speed of the switching element (11) based on the external signal input to the terminal (3d).

Specifically, if the changing unit (221) receives, from the comparator (224), the comparison result indicating that the external signal is larger than the first predetermined value, the output terminal of the changing unit (221) connects to the contact point A instead of the contact point B, and the first speed stored in the first memory (222) is selected as the switching speed. In this case, a signal indicating the first speed is output to the gate voltage control/gate resistance changing circuit (21). Thus, the gate voltage control/gate resistance changing circuit (21) outputs, to the gate terminal of the switching element (11), a driving signal for reducing the gate resistance such that the switching speed of the switching element (11) is the first speed. The first speed may be a speed (acceleration) at which the change amount dv/dt (i.e., switching speed) of the gate voltage per unit time is increased.

In a case in which the changing unit (221) receives, from the comparator (224), the comparison result indicating that the external signal is smaller than the first predetermined value, including the case in which the external signal is not input, the output terminal of the changing unit (221) connects to the contact point B, and the second speed stored in the second memory (223) is selected as the switching speed. In this case, the signal indicating the second speed is output to the gate voltage control/gate resistance changing circuit (21). Thus, the gate voltage control/gate resistance changing circuit (21) outputs, to the gate terminal of the switching element (11), a driving signal for increasing the gate resistance to be larger than the gate resistance at the time when the first speed is selected so that the switching speed of the switching element (11) becomes the second speed. The second speed may be a speed (deceleration) at which the change amount dv/dt (i.e., the switching speed) of the gate voltage per unit time is lower than that of the first speed.

As described above, based on the external signal input to the terminal (3d), the changing unit (221) selects, from a plurality of switching speed types, a switching speed corresponding to the relevant external signal and changes the switching speed to the corresponding one.

In the first embodiment, the changing unit (221) does not perform the foregoing changing operation for the switching speed while the switching element (11) is performing the switching operation. Thus, while the switching element (11) is performing the switching operation, the external signal of a constant value is continuously input to the terminal (3d) of the semiconductor device (10).

As an example, if the first speed is selected, the external signal may be a value of 20 V, and if the second speed is selected, the external signal may be a value of 0 V or a value close to a ground signal of the printed board on which the power module (1) and the gate control circuit (2) are mounted, for example. The first predetermined value is set to a value lower than the voltage (e.g., 20 V) of the external signal when the first speed is selected, and is set to a value higher than the voltage (e.g., 0 V) of the external signal when the second speed is selected.

Note that the value of the input external signal may not be substantially constant and may be unstable in some cases. In that case, the second speed is preferably selected as the switching speed. This is to apply the second speed, which is lower than the first speed, to the situation (application) when the second speed is supposed to be selected. For example, if the first speed is selected when the power module (1) is used as a part of an inverter driving a compressor of an air conditioner, the EMI noise may intensify and other components of the air-conditioning apparatus may be adversely affected. Consequently, if the external signal is unstable and the comparison result from the comparator (224) changes in a relatively short time, the changing unit (221) selects the second speed.

Note that the value of the first speed may be set to, for example, a switching speed twice or more as large as the second speed. Thus, the semiconductor device (10) is suitable for both an application capable of increasing the system efficiency by decreasing a switching loss of the switching element (11) even with a selection of the first speed, and an application capable of decreasing a EMI noise by selecting the second speed, by switching between the first speed and the second speed.

<Changing Operation for Switching Speed of Switching Element Made of a Wide-Bandgap Semiconductor>

For example, silicon carbide (SiC) which is a material for a wide-bandgap semiconductor element has a dielectric breakdown voltage strength that is approximately ten times as high as that of silicon (Si). Thus, a drift layer for securing pressure resistance can be thinned to approximately 1/10 of a drift layer used on silicon (Si). Therefore, the wide-bandgap semiconductor element may achieve lower ON voltage of a power device, and may have a change amount dv/dt of the gate voltage per unit time larger than that of silicon (Si).

To reduce harmonics of a power source, a harmonic suppressor such as an active filter is employed in a driving device of an electric motor for a compressor in an outdoor unit of the air conditioner. In some cases, the foregoing wide-bandgap semiconductor may be employed as a switching element in a power module that is a component of the active filter, or in a power module of an inverter circuit in the driving device. In this way, employing the wide-bandgap semiconductor as the switching element of the power module enables the electric motor for a compressor to operate even at a relatively high temperature.

However, a property required for the wide-bandgap semiconductor differs between a case in which the wide-bandgap semiconductor is used in a harmonic suppressor such as an active filter and a case in which the wide-bandgap semiconductor is used in an inverter circuit in a driving device. That is, since a property required for the wide-bandgap semiconductor differs for each application, the value of the gate driving voltage or the value of the gate driving resistance necessary when the wide-bandgap semiconductor operates also differs for each specific application.

Further, a technique for changing the gate voltage and the gate resistance of a switching element during a switching operation of the switching element or during an operation of a gate control circuit is widely known. However, as described above, the required switching speed in a case in which the switching element in a harmonic suppressor is a wide-bandgap semiconductor is, for example, twice to thrice as different as that in a case in which a switching element of an inverter circuit in a driving device is a wide-bandgap semiconductor. Therefore, in the widely known technique, it is difficult to achieve a switching operation suitable for the application for a harmonic suppressor or an inverter circuit by simply employing a wide-bandgap semiconductor in the switching element.

Specifically, in the harmonic suppressor, a high-efficiency operation with reduced switching loss of the switching element is desirably performed even when the switching speed is increased. In the inverter circuit of the driving device in the electric motor for a compressor, an EMI noise caused by the compressor as a propagation path is a relatively serious problem. Thus, the switching element is operated desirably at a relatively high temperature and at a lower switching speed. As described above, the switching speed required for the wide-bandgap semiconductor varies for each application, and the wide-bandgap semiconductor may achieve a wide range of switching speeds which cannot be achieved by a device of silicon (Si). Therefore, in the widely known technique (i.e. the technique which changes the gate voltage and the gate resistance of a switching element during a switching operation and during an operation of a gate control circuit), it is difficult for the wide-bandgap semiconductor employed as a switching element to achieve the switching speed required for each application.

Further, the density of current which can be fed through the wide-bandgap semiconductor is larger than that of current which can be fed to silicon (Si), for example. That is, the wide-bandgap semiconductor allows a large current to flow therethrough even if having a relatively small size. For this reason, for example, if a semiconductor device including a gate control circuit and a power device is an IPM (Intelligent Power Module), a package size of the IPM can be relatively compact by employing a wide-bandgap semiconductor in the power device. However, in the IPM having a compact package size, a noise in the package intensifies by changing the gate voltage or the gate resistance during the switching operation. The smaller the package size is, the larger the noise becomes, which may lead to a malfunction of the gate control circuit or the IPM itself. In order to avoid this malfunction, a circuit configuration inside the package or a physical configuration of the package itself needs to be complex. Thus, downsizing the package is extremely difficult.

As a countermeasure against this problem, in the first embodiment, a wide-bandgap semiconductor is employed as the switching element (11) of the power module (1), and the changing unit (221) performs an operation to change the switching speed of the switching element (11) to either the first speed or the second speed each of which has different magnitude, in accordance with the external signal input from the outside of the package (P1) (i.e., the outside of the semiconductor device (10)). Specifically, in the first embodiment, the switching speed is appropriately changed for each application to which the semiconductor device (10) is applied. Thus, employing a wide-bandgap semiconductor as the switching element (11) does not require any complex configuration in the package (P1), and with this simple configuration, the switching element (11) may perform the switching operation at the switching speed in accordance with each application.

Specifically, when the first speed is selected, the gate voltage control/gate resistance changing circuit (21) outputs, to the switching element (11), a driving signal for reducing the gate resistance of the switching element (11). Thus, the change amount di/dt of the gate current and the change amount dv/dt of the gate voltage per unit time may be increased (i.e., the switching speed acceleration) while the switching loss of the switching element (11) is being reduced. In a case in which the second speed is selected, the gate voltage control/gate resistance changing circuit (21) outputs, to the switching element (11), a driving signal for increasing the gate resistance of the switching element (11). Thus, the change amount di/dt of the gate current and the change amount dv/dt of the gate voltage per unit time may be decreased (i.e., the switching speed deceleration), and the EMI noise may be reduced.

In the first embodiment, the changing unit (221) does not change the switching speed during the switching operation. Thus, the gate voltage control/gate resistance changing circuit (21) does not change the gate voltage and the gate resistance of the switching element (11) during the switching operation, and maintains the gate voltage and the gate resistance substantially constant. Therefore, the noise in the package (P1) may be avoided from influencing the control operation and the like of the gate control circuit (2).

<Advantages>

In the first embodiment, the switching element (11) and the gate control circuit (2) are accommodated in the same package (P1). When an external signal relating to the switching speed of the switching element (11) is input from the outside of the package (P1) via the terminal (3d) of the package (P1), the changing unit (221) included in the gate control circuit (2) changes the switching speed based on the external signal. Thus, the changing unit (221) can switch the switching speed in correspondence with a variety of applications in which the semiconductor device (10) is applied. Therefore, a single semiconductor device (10) is applicable to a variety of applications without the need to prepare a plurality of the semiconductor devices (10) in separate packages for the respective applications.

Further, the first speed and the second speed, which are different from each other, are stored in the respective memories (222, 223) as available choices of the switching speed. The changing unit (221) selects and changes the switching speed in accordance with the external signal from among the stored plurality of switching speeds based on the input external signal. With this simple configuration, a single semiconductor device (10) is applicable to a wide variety of applications.

Further, the changing operation for the switching speed is not performed while the switching element (11) is performing the switching operation. Consequently, the switching speed is constant while the switching element is performing the switching operation. Thus, the noise in the package (P1) may be avoided from affecting the control operation and the like of the gate control circuit (2).

The switching speed required for the wide-bandgap semiconductor containing silicon carbide, gallium nitride-based material, or diamond varies for each application. The wide-bandgap semiconductor may achieve a wide range of switching speeds that a device of silicon (Si) is unable to achieve. Here, such a wide-bandgap semiconductor is employed as the main material for the switching element (11), but the switching speed is changed depending on an external signal. Therefore, the semiconductor device (10) including the changing unit (221) has a simple configuration and is applicable to a variety of applications.

Second Embodiment

A second embodiment shows an example of a case in which a plurality of power modules of the first embodiment are provided, and the power modules are provided with a plurality of gate voltage control/gate resistance changing circuits.

<Configuration of Semiconductor Device>

Figure 2:
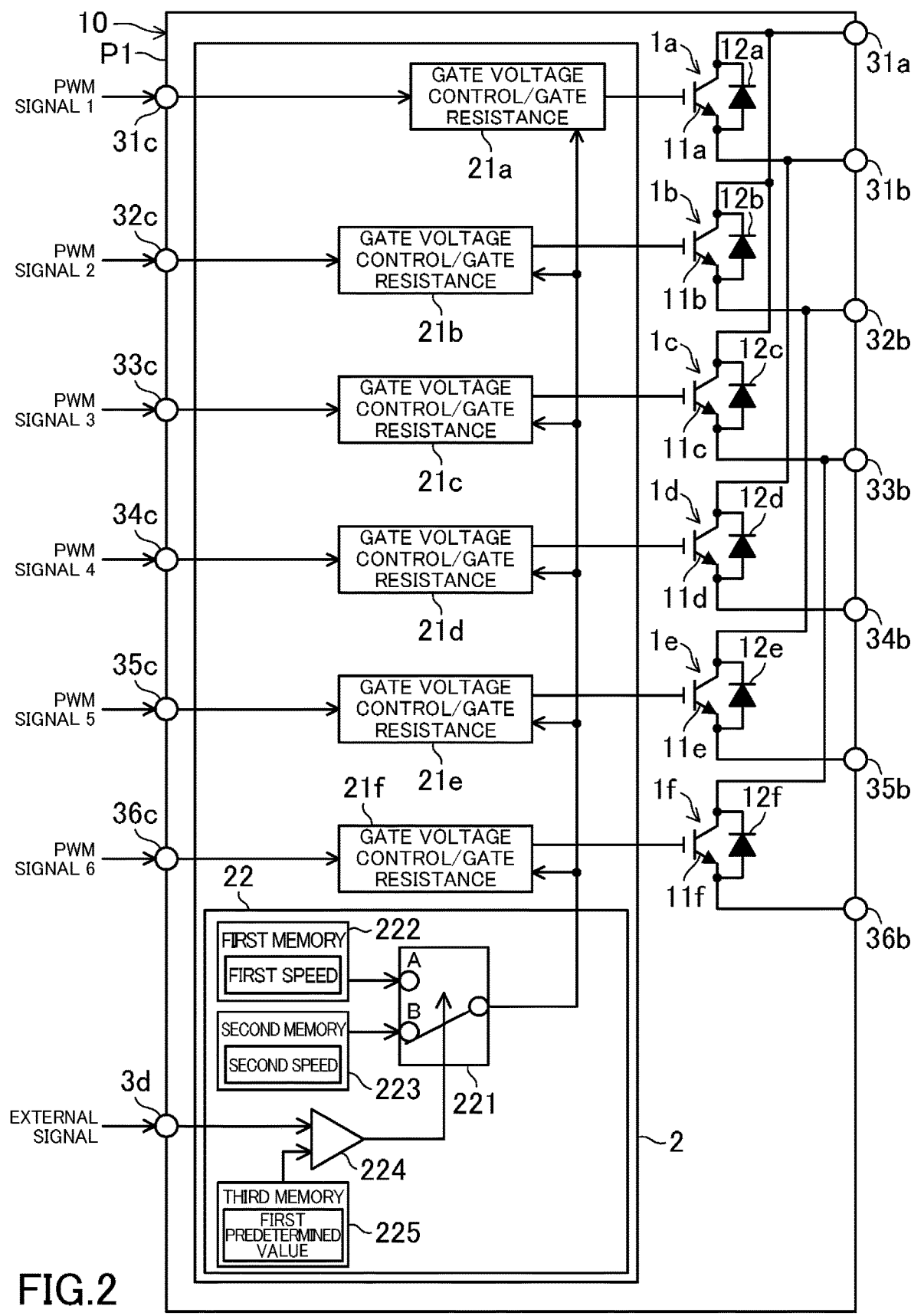
FIG. 2 is a circuit diagram illustrating a configuration of a semiconductor device of a second embodiment.

FIG. 2 is a circuit diagram illustrating a configuration of a semiconductor device (10) of the second embodiment. As shown in FIG. 2, the semiconductor device (10) has a plurality of (in this embodiment, six) power modules (1a to 1f) and a gate control circuit (2) connected to inputs of the power modules (1a to 1f). The plurality of power modules (1a to 1f) and the gate control circuit (2) are accommodated in one chip, i.e., in one package (P1).

Each of the power modules (1a to 1f) includes a switching element (11a to 11f) which is constituted by a wide-bandgap semiconductor, and a freewheeling diode (12a to 12f). The freewheeling diode (12a to 12f) is connected in antiparallel to the switching element (11a to 11f).

That is, the second embodiment shows an example of a case in which the package constituting an inverter with the six switching elements (11 to 11d) is, for example, an IPM (Intelligent Power Module).

An outer periphery of the package (P1) is provided with a plurality of terminals (31a to 31c, 32b to 32c, 33b to 33c, 34b to 34c, 35b to 35c, 36b to 36c, and 3d).

Inside the package (P1), the terminal (31a) is connected to a drain terminal of each of the switching elements (11a, 11b, and 11c), and the terminal (31b) is connected to a source terminal of the switching element (11a) and the drain terminal of the switching element (11d). The terminal (32b) is connected to a source terminal of the switching element (11b) and a drain terminal of the switching element (11e). The terminal (33b) is connected to a source terminal of the switching element (11c) and the drain terminal of the switching element (11f). The terminals (34b, 35b, and 36b) are connected to the respective source terminals of the switching elements (11d, 11e, and 11f). Outside the package (P1), terminals (31a, 31b, 32b, 33b, 34b, 35b, and 36b) are connectable to a target (for example, an electric motor for a compressor of an air conditioner) to which the power modules (1a to 1f) supply electric power.

Inside the package (P1), the terminals (31c, 32c, 33c, 34, 35c, and 36c) are connected to the corresponding gate voltage control/gate resistance changing circuits (21a to 21f) in the gate control circuit (2). PWM signals 1 to 6 are input to the respective terminals (31c, 32c, 33c, 34, 35c, and 36c) from the outside of the package (P1). The PWM signals 1 to 6 are input to the respective corresponding gate voltage control/gate resistance changing circuits (21a to 21f) via the terminals (31c, 32c, 33c, 34, 35c, and 36c).

Inside the package (P1), the terminal (3d) is connected to the switching speed selection circuit (22) in the gate control circuit (2). An external signal similar to that of the first embodiment is input to the terminal (3d) from the outside of the package (P1). The external signal is input to the switching speed selection circuit (22) via the terminal (3d).

The gate control circuit (2) has a plurality of (in this embodiment, six) gate voltage control/gate resistance changing circuits (21a to 21f) corresponding to the respective power modules (1a to 1f), and the single switching speed selection circuit (22).

The gate voltage control/gate resistance changing circuits (21a to 21f) are connected to the respective gate terminals of the switching elements (11a to 11f), and output the driving signal for increasing the gate driving voltage or reducing the gate driving resistance in order to achieve the switching speed set in the switching speed selection circuit (22).

The switching speed selection circuit (22) is the same as that of the first embodiment.

<Switching Speed Changing Operation of Switching Element>

The switching speed changing operation described in the first embodiment is performed in the second embodiment, as well.

That is, in the second embodiment, wide-bandgap semiconductors are employed as switching elements (11a to 11f). The changing unit (221) selects, as the switching speed for each of the switching elements (11a to 11f), either the first speed or the second speed each of which has different magnitude, in accordance with the external signals input from the outside of the package (P1) (i.e., the outside of the semiconductor device (10)). The switching speed is changed to the appropriate speed for each application to which the semiconductor device (10) is applied.

Thus, employing wide-bandgap semiconductors as the switching elements (11 to 11f) does not require any complex configuration of the package (P1), and the switching element (11 to 11f) can perform the switching operation for the switching speed in accordance with each application with a simple configuration. Additionally, the inverter may be downsized.

<Advantages>

The second embodiment provides the same advantages and effects as those of the first embodiment.

Third Embodiment

A third embodiment shows an example of a case in which the two changing units of the first embodiment are provided.

<Configuration of Semiconductor Device>

Figure 3:
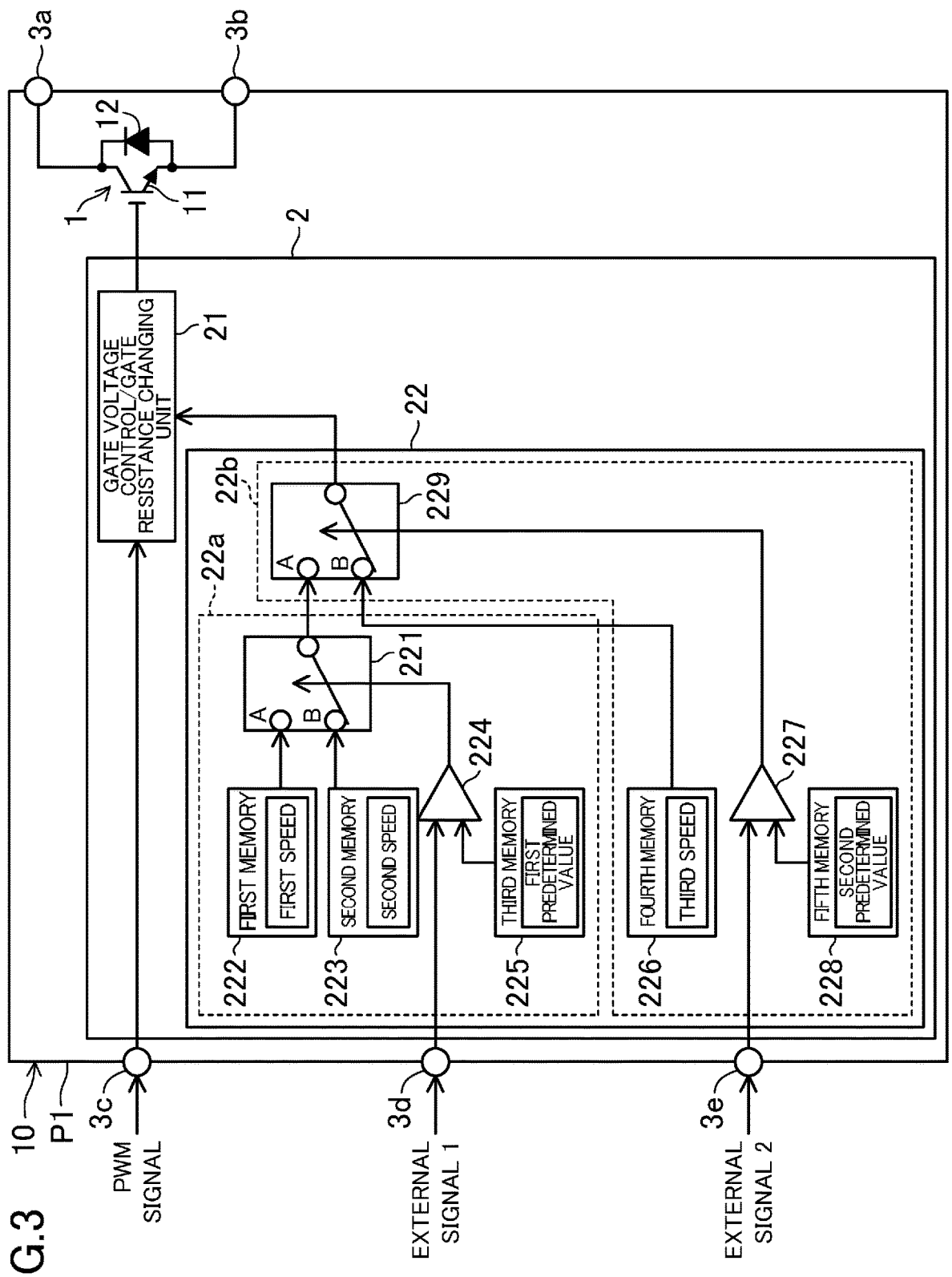
FIG. 3 is a circuit diagram illustrating a configuration of a semiconductor device of a third embodiment.

FIG. 3 is a circuit diagram illustrating a configuration of a semiconductor device (10) of the third embodiment. In FIG. 3, the semiconductor device (10) is configured such that external signals 1 and 2 having different types are input to the respective terminals (3d and 3e) of a package, and a switching speed is selected from a first speed, a second speed, or a third speed in correspondence with each of the external signals 1 and 2.

As shown in FIG. 3, the semiconductor device (10) includes a power module (1) and a gate control circuit (2), which are the same as those of the first embodiment. In addition to terminals (3a to 3d) which are the same as those of the first embodiment, a terminal (3e) is provided outside the package (P1) housing the power module (1) and the gate control circuit (2)

The terminal (3e) is an input section which is the same as the terminal (3d), and receives an external signal from the outside of the package (P1) (i.e., the outside of the semiconductor device (10)). An external signal input to the terminal (3d) and an external signal input to the terminal (3e) are different signals. Thus, hereinafter, the external signal input to the terminal (3d) is referred to as an "external signal 1", and the external signal input to the terminal (3e) is referred to as an "external signal 2."

The gate control circuit (2) has a gate voltage control/gate resistance changing circuit (21) and a switching speed selection circuit (22), which are the same as those of the first embodiment.

The switching speed selection circuit (22) includes a first changing circuit (22a) and a second changing circuit (22b).

The first changing circuit (22a) is the same as the switching speed selection circuit (22) of the first embodiment, except that an output of a changing unit (221) is connected to a changing unit (229) in the second changing circuit (22b) which will be described later. For this reason, the components in the first changing circuit (22a) are denoted by the same reference numerals as those in the switching speed selection circuit (22) of the first embodiment.

The second changing circuit (22b) includes a fourth memory (226), a fifth memory (228), a comparator (227), and a changing unit (229) which is a changing section.

Each memory (226, 228) is constituted by, for example, a semiconductor memory. In the fourth memory (226) corresponding to the storage unit, a third speed that is different from the first speed and the second speed is stored in advance. The fifth memory (228) stores a second predetermined value set to an appropriate value in advance.

The comparator (227) is constituted by, for example, a comparator circuit. The fifth memory (228) and the terminal (3e) are connected to the two input terminals of the comparator (227). The respective input terminals input the second predetermined value and the external signal 2. An output terminal of the comparator (227) is connected to the changing unit (229). When the comparator (227) receives the external signal 2 from the outside of the package (P1) (the outside of the semiconductor device (10)) via the terminal (3e), the comparator (227) compares the external signal 2 with the second predetermined value. The comparator (227) outputs the result of the comparison from the output terminal to the changing unit (229).

The changing unit (229) is constituted by, for example, a switch. An output from the changing unit (221) in the first changing circuit (22a) is connected to the contact point A of the changing unit (229), and a fourth memory (226) is connected to the contact point (B) of the changing unit (229). Further, an output of the comparator (227) is connected to the changing unit (229) to which the comparison result of the comparator (227) is input. An output terminal of the changing unit (229) is connected to the gate voltage control/gate resistance changing circuit (21). The changing unit (229) changes the switching speed of the switching element (11) based on the signal output from the changing unit (221) and the external signal 2 input to the terminal (3e).

<Changing Control Operation for Switching Speed>

A switching speed changing operation is performed in the third embodiment, as well. That is, a wide-bandgap semiconductor is employed as the switching element (11). The changing unit (221, 229) selects, as the switching speed for the switching element (11), any one of the first speed, the second speed, or the third speed each of which has different magnitude, in accordance with the external signals 1 and 2 input from the outside of the package (P1) (the outside of the semiconductor device (10)).

In particular, in the third embodiment, the switching speed selection circuit (22) has the above-described configuration, thus any one of the three switching speeds is selected. For this reason, the semiconductor device (10) of the third embodiment may be applied to more kinds of applications than the semiconductor devices (10) of the first and second embodiments.

In FIG. 3, the switching speed may be set to any one of the three switching speeds including the first speed, the second speed, and the third speed, but two external signals are input from the outside of the package (P1). Therefore, in the third embodiment, there are four patterns of selecting and setting the switching speed if, for example, 20V or 0V is selected as each of the external signals 1 and 2, as shown in the table below. Note that the fourth speed is the lowest switching speed as compared to the first to third speeds, and is, so to speak, a default value. The switching speeds of the third embodiment from the highest to the lowest are as follows: the first speed, the second speed, the third speed, and the fourth speed in this order.

TABLE 1

|  |  | External Signal 2 | |
| --- | --- | --- | --- |
|  |  | 0 V | 20 V |
| External Signal 1 | 0 V | Fourth Speed | Third Speed |
|  | 20 V | Second Speed | First Speed |

<Advantages>

The third embodiment achieves the same advantages and effects as those of the first embodiment.

In addition, in the third embodiment, as shown in the table above, there are more selectable switching speeds, and the semiconductor device (10) of the third embodiment is applicable to more kinds of applications than that of the first embodiment.

Fourth Embodiment

In the fourth embodiment, as in the second embodiment, a plurality of power modules (1a to 1f) are provided, and a plurality of gate voltage control/gate resistance changing circuits (21a to 21f) are provided for the respective power modules (1a to 1f). The difference from the second embodiment is that the switching speeds of switching elements (11a to 11f) in the power modules (1a to 1f) are changed by serial signals (corresponding to the external signals) input from the outside of the package (P1).

Figure 4:
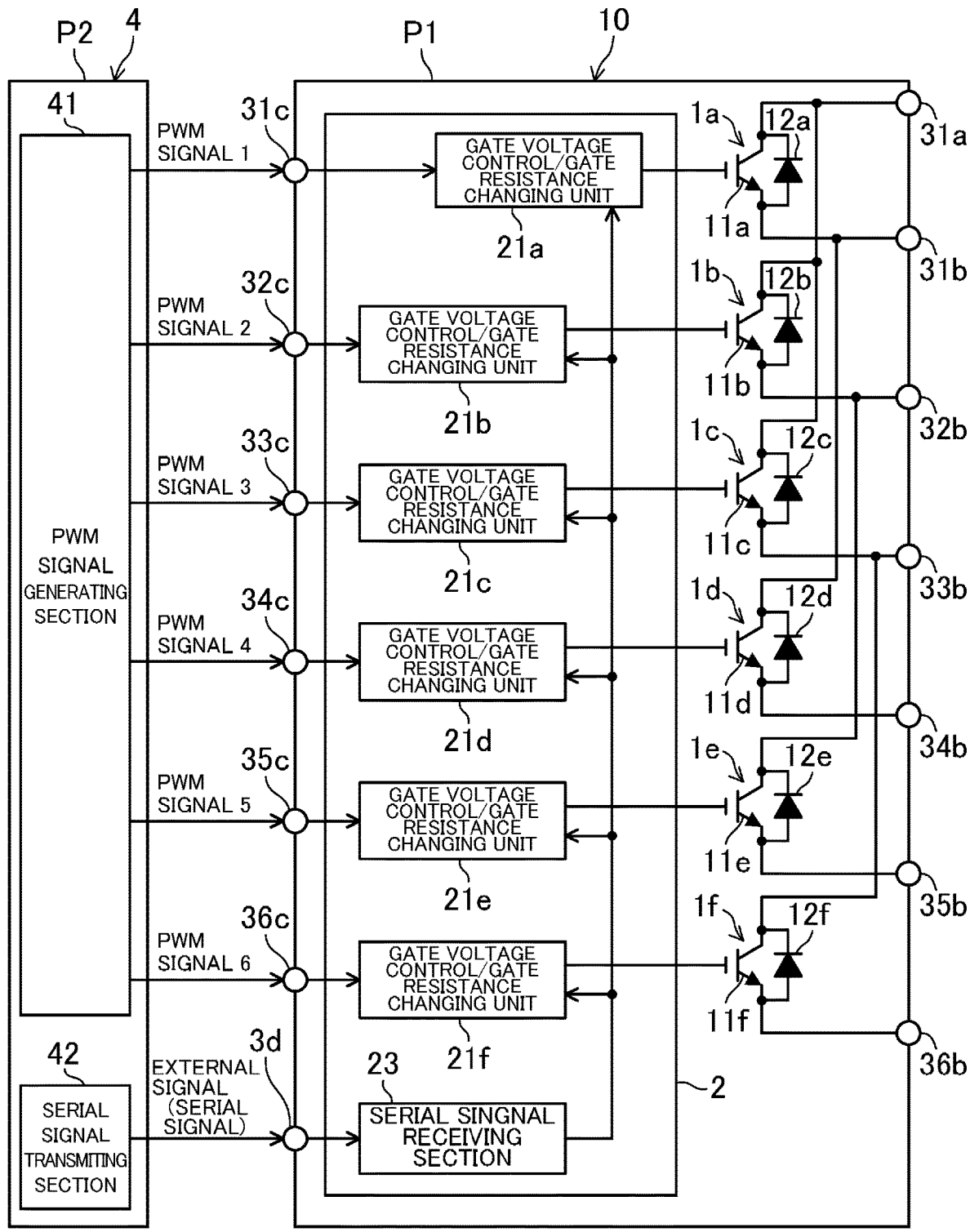
FIG. 4 is a circuit diagram illustrating a configuration of a system including a semiconductor device of a fourth embodiment and a PWM signal generator.

FIG. 4 is a circuit diagram of a system including a semiconductor device (10) of the fourth embodiment housed in one package (P1), and a PWM signal generator (4) housed in a package (P2) separate from the package (P1).

<Configuration of Semiconductor Device>

The semiconductor device (10) of the fourth embodiment is the same as that of the second embodiment except for including a serial signal receiving section (23) as a changing section instead of a switching speed selection circuit (22) in the second embodiment. For this reason, the components of the semiconductor device (10) in FIG. 4 except for the serial signal receiving section (23) are denoted by the same reference numerals as those in FIG. 2.

The serial signal receiving section (23) includes, as a serial port, a terminal (3d) which is an input section provided outside of the package (P1), and receives the serial signal which is an external signal from the outside of the package (P1). The serial signal receiving section (23) converts the received serial signals into signals recognizable by the gate voltage control/gate resistance changing circuits (21a to 21f), and then outputs the signals to the gate voltage control/gate resistance changing circuits (21a to 21f).

Each of the gate voltage control/gate resistance changing circuits (21a to 21f) outputs a driving signal for increasing the gate driving voltage or decreasing the gate driving resistance of each of the switching elements (11a to 11f) to the gate terminal of each of the switching elements (11 to 11f) in accordance with the converted signals and each of the PWM signals 1 to 6 input from the outside of the package (P1) (the outside of the semiconductor device (10)) via each of the terminals (31c to 36c).

<Configuration of PWM Signal Generator>

The PWM signal generator (4) includes a PWM signal generating section (41) and a serial signal transmitting section (42). The PWM signal generating section (41) and the serial signal transmitting section (42) are accommodated in one chip, i.e., in one package (P2) separate from the package (P1).

The PWM signal generator (4) is constituted by, for example, a microcomputer and generates PWM signals 1 to 6 which are input to the respective gate voltage control/gate resistance changing circuits (21a to 21f) via the terminals (31c to 36c) of the semiconductor device (10).

The serial signal transmitting section (42) is constituted by, for example, a microcomputer, and generates a serial signal which is input to the serial signal receiving section (23) via the terminal (3d) of the semiconductor device (10).

<Serial Signal>

The serial signal is a signal representing data which relates to a switching speed of each of the switching elements (11a to 11f). The data is serially transmitted, one bit at a time, as a serial signal from the serial signal transmitting section (42) to the serial signal receiving section (23).

The serial signal receiving section (23) is constituted by, for example, a shift register, performs a serial-parallel conversion of the serial signal input (received) via the terminal (3d), and assembles, for example, approximately one-byte data.

If the serial signal transmitting section (42) transmits the switching speed that should be set in each of the switching elements (11a to 11f) by, for example, one-byte data, the serial signal transmitting section (42) converts a value of the switching speed to 8-bit data and transmits it as a serial signal. That is, in the fourth embodiment, 256 switching speeds can be set.

<Switching Speed Changing Operation of Switching Element>

The same switching speed changing operation as in the second embodiment is performed in the fourth embodiment, as well.

That is, a wide-bandgap semiconductor is employed as each of the switching elements (11a to 11f). In accordance with the serial signal input from the outside of the package (P1) (the outside of the semiconductor device (10)), the serial signal receiving section (23), which is the changing section, changes the switching speed of each of the switching elements (11a to 11f) to the speed corresponding to the serial signal. In this manner, in the fourth embodiment, the switching speed is changed to an appropriate speed for each application to which the semiconductor device (10) is applied.

Thus, employing wide-bandgap semiconductors as the switching elements (11 to 11f) does not require any complex configuration of the package (P1), and the switching element (11 to 11f) can perform the switching operation for the switching speed in accordance with each application with a simple configuration. Additionally, the inverter may be downsized.

<Advantages>

The fourth embodiment achieves the same advantages and effects as those of the first embodiment.

In particular, in the fourth embodiment, using the serial signal as an external signal enables changes of the switching speed to 256 switching speeds, while the input terminal of the external signal is the single terminal (3d). Therefore, the fourth embodiment gives more choices for the switching speed in one input terminal (terminal (3d)) at low cost, than the case of using an external signal which is an analog signal as in the first to third embodiments.

Fifth Embodiment

A fifth embodiment shows an example of a case in which the switching speed selection circuit (22) further includes a memory holding unit (231) in the second embodiment.

<Configuration of Semiconductor Device>

Figure 5:
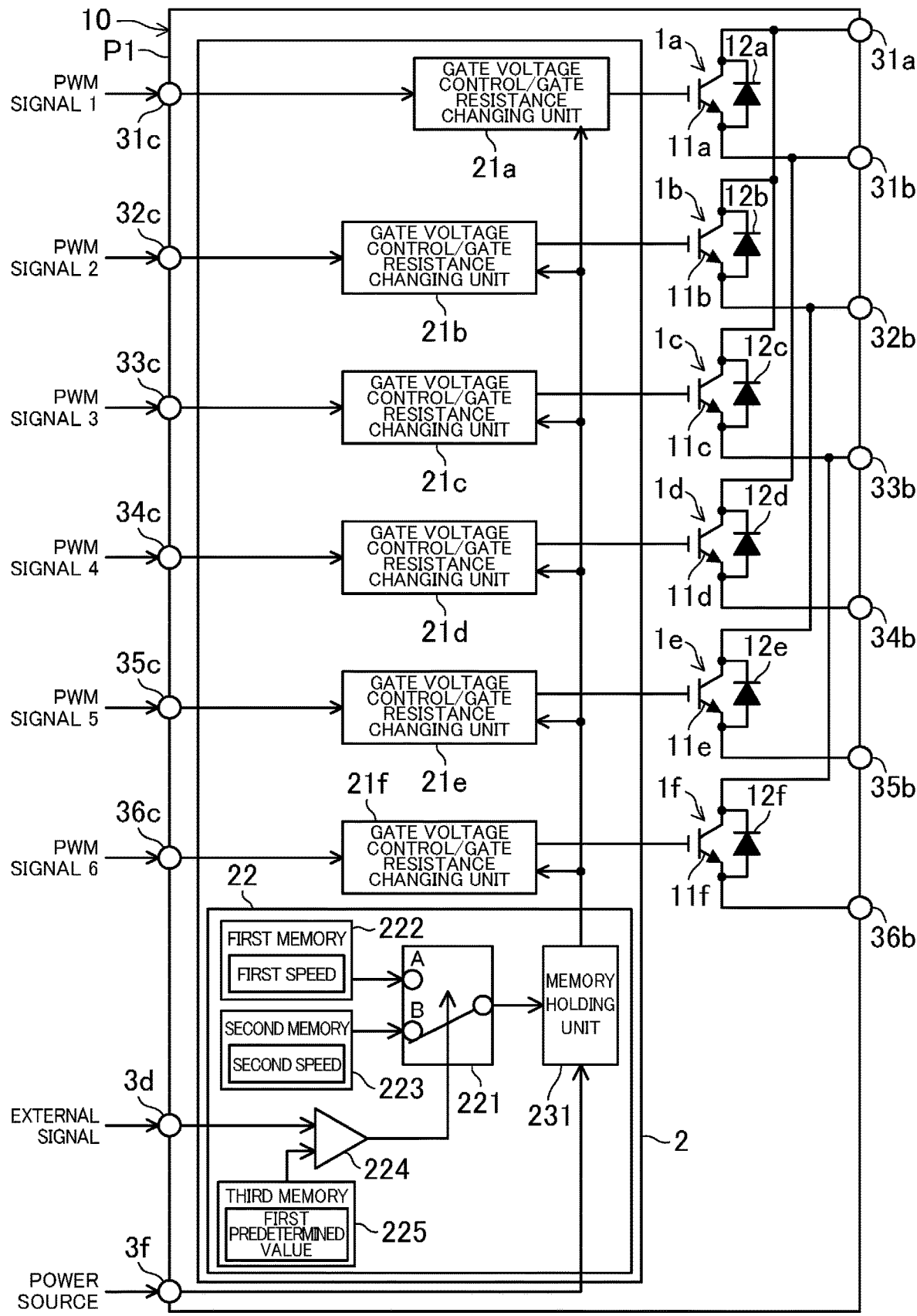
FIG. 5 is a circuit diagram illustrating a configuration of a semiconductor device according to a fifth embodiment.

FIG. 5 is a circuit diagram illustrating a configuration of a semiconductor device (10) of the fifth embodiment.

The configuration of the semiconductor device (10) shown in FIG. 5 except for the memory holding unit (231) is the same as that of the second embodiment. For this reason, all of the components in FIG. 5 except for the memory holding unit (231) are denoted by the same reference numerals as those in FIG. 2.

The package (P1) of the semiconductor device (10) is provided with a power source terminal (30 besides the terminals (31a to 31c, 32b to 32c, 33b to 33c, 34b to 34c, 35b to 35c, 36b to 36c, and 3d). A power source for driving the semiconductor device (10) is supplied to the power source terminal (3f) from the outside of the package (P1) (the outside of the semiconductor device (10)).

The memory holding unit (231) is connected to the power source terminal (30 through which a power source is supplied from the outside of the semiconductor device (10). Inside the package (P1), the input of the memory holding unit (231) is connected to an output of the changing unit (221) in the switching speed selection circuit (22), and the output of the storage section (231) is connected to an input of each of the gate voltage control/gate resistance changing circuits (21a to 21f). The memory holding unit (231) has a function of storing an output signal from the changing unit (221) after a lapse of a predetermined time from the supply of the power source from the power source terminal (30.

Specifically, the memory holding unit (231) stores (latches) the switching speed selected by the changing unit (221) until a power source of the power module (1) is turned off after a lapse of a predetermined time, which is about several seconds, from the input of, for example, 20 V which is the power source. In this way, the risk of intensifying the noise in the package (P1) and thereby causing malfunction of the semiconductor device (10) is significantly reduced.

<Switching Speed Changing Operation>

The same switching speed changing operation as in the second embodiment is performed in the fifth embodiment, as well.

That is, a wide-bandgap semiconductor is employed as each of the switching elements (11a to 11f). The changing unit (221) changes the switching speed of each of the switching elements (11a to 11f) in accordance with the external signals input from the outside of the package (P1) (the outside of the semiconductor device (10)). In this manner, in the fifth embodiment, the switching speed is changed to an appropriate speed for each application to which the semiconductor device (10) is applied.

In particular, in the fifth embodiment, the switching speed selected by the changing unit (221) is stored (latched) by the memory holding unit (231) (latch operation) until a power source is turned off after a lapse of a predetermined time from the input of the power source. Hereinafter, the latch operation will be described with reference to FIGS. 6 and 7.

Figure 6:
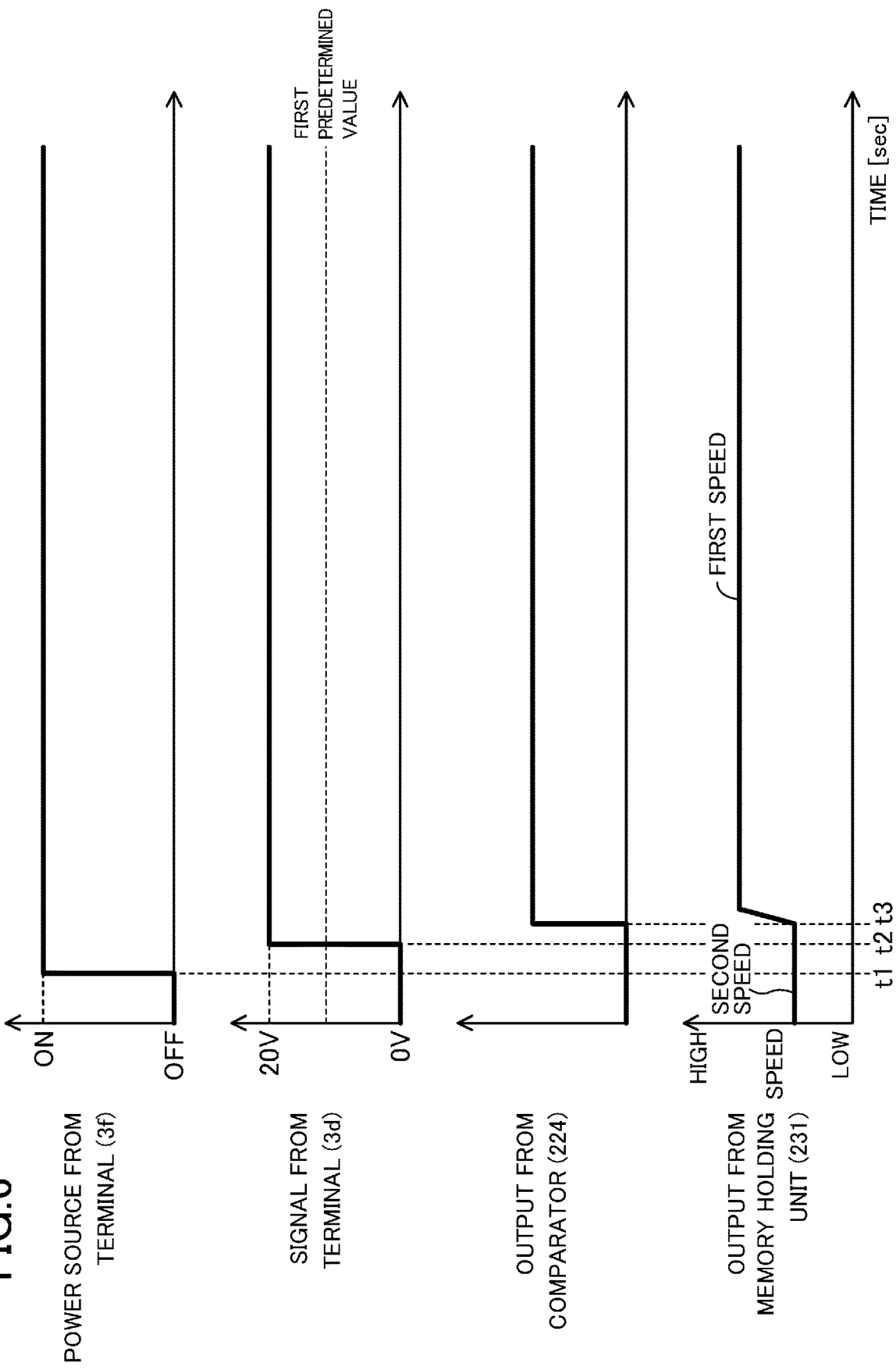
FIG. 6 illustrates temporal changes in ON and OFF states of a power source, the contents of an external signal, an output of a comparator, and a memory holding state of a memory holding unit, with a selection of a first speed.
Figure 7:
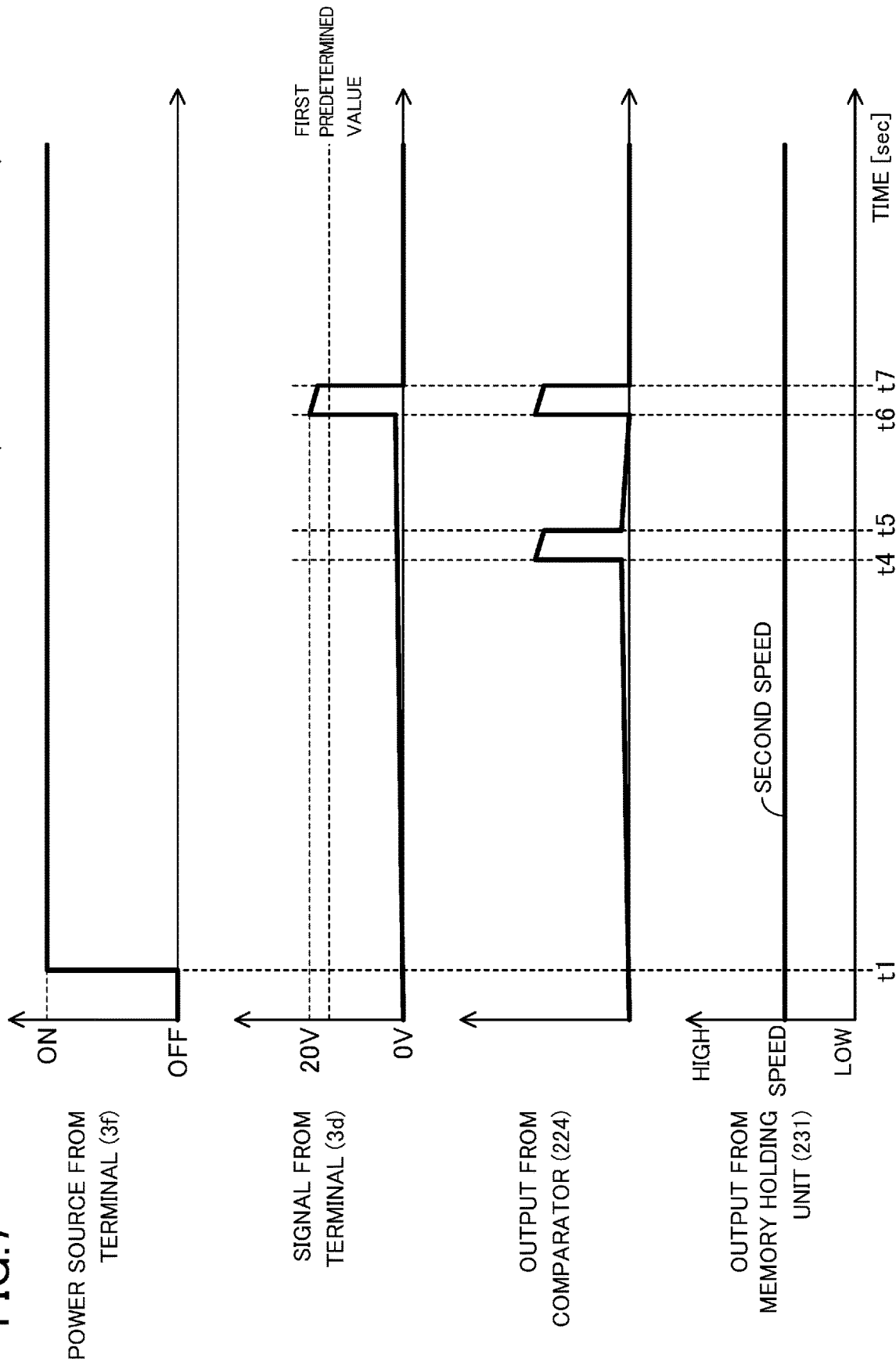
FIG. 7 illustrates temporal changes in ON and OFF states of a power source, the contents of an external signal, an output of the comparator, and a memory holding state of the memory holding unit, in ON and OFF states of the power source, with selection of a second speed.

FIGS. 6 and 7 show temporal changes in ON and OFF states of the power source to be applied (input) to the power source terminal (30, the contents of an external signal, an output of the comparator (224), and a memory holding state of the memory holding unit (231). The horizontal axis in FIGS. 6 and 7 represents time [sec].

FIG. 6 illustrates an example of a case in which the first speed (switching speed: "high") is selected. FIG. 7 illustrates an example of a case in which the second speed (switching speed: "low") is selected.

—When First Speed is Selected—

Suppose that, at time t1 in FIG. 6, a power source input to the power source terminal (30 of the package (P1) is switched from OFF to ON, and, at time t2 after a lapse of several microseconds from the time t1, the external signal of 20V is input from the terminal (3d) of the package (P1), the following operation is performed. When the comparator (224) determines that the external signal of 20V exceeds the first predetermined value, the comparator (224) outputs a comparison result indicating that the external signal exceeds the first predetermined value to the changing unit (221) at time t3 after a lapse of several microseconds from the time t2. In accordance with the comparison result, the changing unit (221) changes a connection destination of the output terminal of the changing unit (221) itself from the contact point B for which the second speed, which is the low switching speed, is selected, to the contact point A for which the first speed, which is the high switching speed, is selected. In response to the changing of the contact point, the gate voltage control/gate resistance changing circuits (21a to 21f) output the driving signal for performing the switching operation at the first speed to the respective gate terminals of the switching elements (11a to 11f) in the power modules (1a to 1f).

Information that the switching speed has been changed from the second speed to the first speed at the time t3 is stored and held in the memory holding unit (231) (latch operation) until the power source is turned off. Accordingly, even if the noise in the package (P1) intensifies, the phenomenon of erroneously changing the switching speed from the first speed to the second speed due to the noise is less likely to occur.

—When Second Speed is Selected—

Suppose that, at time t1 in FIG. 7, the power source input to the power source terminal (3f) of the package (P1) is switched from OFF to ON, and the external signal input from the terminal (3d) of the package (P1) is 0 V, the following operation is performed. In this case, since the external signal is lower than the first predetermined value, the comparator (224) outputs the comparison result indicating that the external signal is lower than the first predetermined value to the changing unit (221), and the changing unit (221) does not change the contact point. This means, the changing unit (221) maintains the state of the output terminal in connection with the contact point B for which the second speed, which is a low switching speed, is selected. In response to this state, the gate voltage control/gate resistance changing circuits (21a to 21f) output the driving signal for performing the switching operation at the second speed to the respective gate terminals of the switching elements (11a to 11f) in the power modules (1a to 1f).

The memory holding unit (231) stores and holds the information that the second speed has been selected as the switching speed (latch operation), until the power source is turned off.

Therefore, during a time period from the time t4 to the time t5, a noise obstructs the signal output from the comparator (224), thereby changing the signal, but the second speed is maintained selected. Further, during a time period from the time t6 to the time t7, the comparator (224) determines that the external signal exceeds the first predetermined value due to the obstacle of the noise in the external signal input from the terminal (3d) of the package (P1). However, during the time period from the time t6 to the time t7, the second speed is still maintained selected.

<Advantages>

The fifth embodiment achieves the same advantages and effects as those of the first embodiment.

In particular, in the fifth embodiment, the output from the changing unit (221) is held by the memory holding unit (231). Accordingly, even if the noise in the package (P1) intensifies and the external signal temporarily changes, the phenomenon of changing the switching speed erroneously from the first speed to the second speed is less likely to occur.

OTHER EMBODIMENTS

If a plurality of switching elements (11a to 11f) are provided in the semiconductor device (10) as in the second, fourth, and fifth embodiments, a configuration in which the switching speed is changed to three or more switching speeds may be employed in the same manner as in the third embodiment.

If the semiconductor device (10) includes one switching element (11) as in the first and third embodiments, a configuration in which the switching speed is changed by the serial signal as in the fourth embodiment may be employed.

The memory holding unit (231) of the fifth embodiment may be further employed in the first to fourth embodiments.

In the first to fifth embodiments, it is not essential that no changing operation for the switching speed is performed while the switching operation is being performed.

In the first to fifth embodiments, it is not essential for the switching element to be constituted by a wide-bandgap semiconductor. The switching element may be constituted by a semiconductor (e.g., silicon (Si)) other than the wide-bandgap semiconductor.

While the embodiments and modifications have been described above, it will be understood that various changes in form and details can be made without departing from the spirit and scope of the claims. The above embodiments and modifications may be appropriately combined or replaced as long as the functions of the target of the present disclosure are not impaired.

INDUSTRIAL APPLICABILITY

As can be seen from the foregoing description, the present disclosure is useful as a semiconductor device.

EXPLANATION OF REFERENCES 3d, 3e Terminal (Input Section)
10 Semiconductor Device
11, 11a to 11f Switching Element
21, 21a to 21f Gate Voltage Control/Gate Resistance Changing Circuit (Switching Control Unit)
221, 229, 23 Changing Unit (Changing Section)
222, 223, 226 Memory (Storage Unit)
P1 Package

The invention claimed is:

1. A semiconductor device comprising:
a switching element;
a switching control unit accommodated in a same package as the switching element and outputs a driving signal to the switching element to control turning on and off of the switching element;
an input section that receives an external signal relating to a switching speed at which the switching element is turned on and off, input from the outside of the package; and
a changing section accommodated in the package, and changes the switching speed of the switching element from a first speed to a second speed based on a comparison between a value of the external signal and a predetermined value, wherein
in response to a change in a result of the comparison between the value of the external signal and predetermined value in a relatively short time due to an instability of the external signal, the changing section changes the switching element from the first speed to the second speed,
the first speed comprises a first value and the second speed comprises a second value, and
the second value is less than the first value.

2. The semiconductor device of claim 1, further comprising:
storage units configured to store a plurality of switching speeds, wherein
the changing section selects and changes the switching speed from the plurality of the switching speeds in accordance with the external signal, based on the external signal input to the input section.

3. The semiconductor device of claim 1, wherein
the changing section does not perform a changing operation for the switching speed while the switching element is performing the switching operation.

4. The semiconductor device of claim 1, wherein
the switching element is a semiconductor element made of a wide-bandgap semiconductor as a main material, and
the wide-bandgap semiconductor includes silicon carbide, gallium nitride-based material, or diamond.

* * * * *